(12) United States Patent
LaBerge et al.

(10) Patent No.: US 7,707,473 B2
(45) Date of Patent: Apr. 27, 2010

(54) INTEGRATED TESTING APPARATUS, SYSTEMS, AND METHODS

(75) Inventors: Paul A. LaBerge, Shoreview, MN (US);
Jeffrey J. Rooney, Blaine, MN (US);
Charles K. Snodgrass, Bosie, ID (US)

(73) Assignee: Micron Technology, Inc., Boise, ID (US)

( * ) Notice: Subject to any disclaimer, the term of this patent is extended or adjusted under 35 U.S.C. 154(b) by 698 days.

(21) Appl. No.: 11/497,849

(22) Filed: Aug. 2, 2006

(65) Prior Publication Data

US 2008/0052585 A1  Feb. 28, 2008

(51) Int. Cl.
*G06F 11/00* (2006.01)
*G11C 29/00* (2006.01)
*G01R 31/02* (2006.01)
*G01R 31/26* (2006.01)

(52) U.S. Cl. .................. 714/738; 714/723; 714/704; 324/763; 324/765

(58) Field of Classification Search .................. None
See application file for complete search history.

(56) References Cited

U.S. PATENT DOCUMENTS

| 6,727,723 B2 * | 4/2004 | Shimizu et al. ............. 324/765 |
| 7,254,757 B2 * | 8/2007 | Park et al. .................... 714/718 |
| 2003/0099139 A1 * | 5/2003 | Abrosimov et al. ......... 365/200 |

* cited by examiner

*Primary Examiner*—Christine T Tu
(74) *Attorney, Agent, or Firm*—Schwegman, Lundberg & Woessner, P.A.

(57) ABSTRACT

Embodiments herein may enable an algorithmic pattern generator (APG) to present iterative values of one or more operational parameters to a device under test (DUT). At each iteration, one or more test patterns may be presented to the DUT. The APG may capture test results from a set of iterations of the operational parameters. The APG may also write values associated with a next operational parameter to be iterated to a test parameter configuration space within the device tester.

35 Claims, 3 Drawing Sheets

FIG. 3 ated with test equipment, includ-
INTEGRATED TESTING APPARATUS, SYSTEMS, AND METHODS

TECHNICAL FIELD

Various embodiments described herein relate to apparatus, systems, and methods associing microelectronic device test equipment.

BACKGROUND INFORMATION

Automatic test equipment (ATE) may be used to test microelectronic devices during production or in a quality assurance context. Some ATE systems may generate a test pattern and present the test pattern to inputs of a microelectronic device under test (DUT). The ATE may then measure or sense output responses from the DUT. A comparison of the test pattern presented at the DUT inputs and the output responses may thus comprise a DUT transfer function. The ATE may make quality and reliability judgements about the microelectronic device based upon the transfer function.

Clocking speeds associated with modern digital microelectronic devices may impose limitations on lengths of cables used to deliver the test pattern to the DUT. Impedances associated with connectors and excessively long cables may create undesirable timing shifts in the test pattern as applied to the DUT. Because of these constraints, it may be desirable to locate a compact test pattern generator portion of the ATE close to the DUT. However, the compact nature of the test pattern generator may preclude collocating all of the desired ATE processing functions at the test pattern generator.

As a result, some ATE may separate the test pattern generation and response collection functions from administrative and post-processing functions. An administrative host computer (AHC) may be connected to the test pattern generator in a master/slave relationship. The AHC may download test patterns to the test pattern generator and may collect test results periodically for analysis, reporting, and storage.

Some ATE systems may present test patterns under nominal conditions of operating voltages, timing, and temperature. Other ATE systems may be parametric. That is, they may be capable of varying voltage, timing, temperature, and other operational parameters incrementally as testing is performed. A parametric tester may download a set of values associated with a parameter to be varied from the AHC to the test pattern generator. The test pattern generator may vary the parameter according to the downloaded values as it repeatedly presents the test pattern to the DUT. Parametric ATE may thus provide insight into operational margins associated with the DUT. However, test times may increase as the test pattern generator pauses to receive new parameter values from the AHC.

DETAILED DESCRIPTION

Embodiments herein may include an algorithmic pattern generator (APG) associated with a microelectronic device tester. The APG may present iterative values of one or more operational parameters to a DUT. At each iteration, one or more test patterns may be presented to the DUT. The APG may capture test results from a set of iterations of the operational parameter(s) without AHC intervention. The APG may also access test parameter configuration space within the microelectronic device tester without AHC intervention. The APG may write values associated with a next operational parameter to be iterated to the configuration space.

As a result, an entire suite of parametric tests, iterated over the operational parameter(s), may be performed on the DUT without AHC intervention. Test times may be reduced as a result. The operational parameters may include timing parameters, operational voltages, and operational temperatures, among others. An operational parameter iterated within a test sequence may be denominated as a "test parameter" herein.

Figure 1:
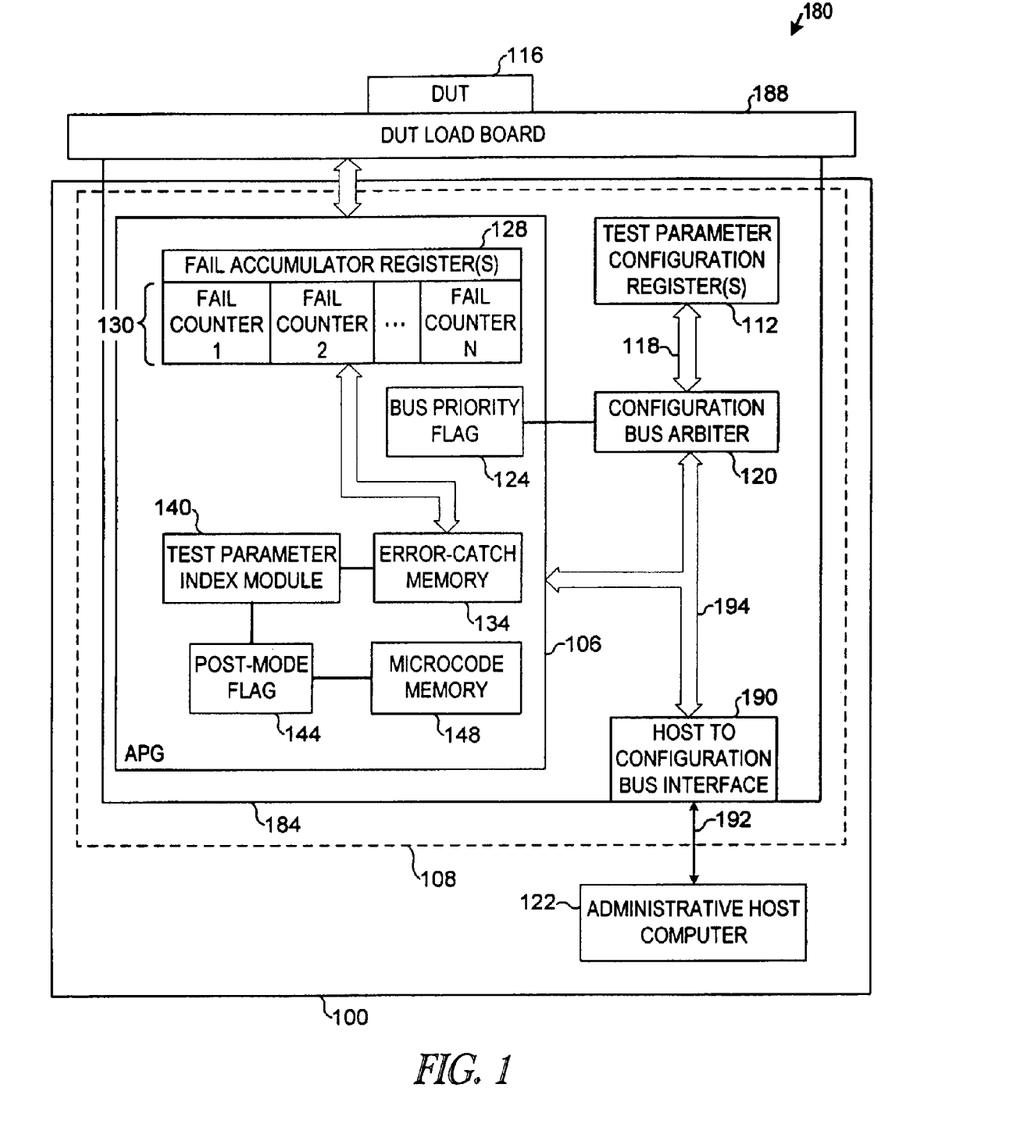
FIG. 1 is a block diagram of an apparatus and a representative system according to various embodiments.

FIG. 1 comprises a block diagram of an apparatus 100 and a system 180. The apparatus 100 may include an APG 106. The APG 106 may be associated with a microelectronic device tester 108, which may comprise a parametric memory device tester, among other types of testers. In some embodiments, the microelectronic device tester 108 may be integrated onto a single semiconductor die.

The apparatus 100 may also include one or more test parameter configuration registers (TPCRs) 112 operatively coupled to the APG 106. The TPCRs 112 may store values of the operational parameter(s) to be varied as test patterns are presented to a DUT 116. A configuration register bus 118 may be operatively coupled to the APG 106 and to the TPCRs 112. The configuration register bus 118 may enable write operations from the APG 106 to the TPCRs 112.

A configuration bus arbiter 120 may be coupled to the TPCRs 112. The configuration bus arbiter 120 may arbitrate access to the configuration register bus 118 from the APG 106 and from an AHC 122. Some embodiments may be capable of selectively loading the TPCRs from the APG or from the AHC. A bus priority flag 124 may be operatively coupled to the configuration bus arbiter 120 to prioritize access to the configuration register bus 118. The APG may exercise control of the bus priority flag 124 to grant itself priority to the configuration register bus 118 when loading the TPCRs.

The apparatus 100 may further include one or more fail accumulation registers (FARs) 128 associated with the APG 106. Each bit position of the FARs 128 may correspond to a data line of the DUT 116. The bit position may record one or more test failures associated with the data line as memory locations associated with the DUT 116 are accessed. In some embodiments, a failed bit may be logically OR'd with a bit value currently stored in the FARs 128 at the bit position corresponding to the data line.

Following a test pattern presented to the DUT 116 at one or more memory locations, the FARs 128 may contain an accumulation of failed data bits resulting from several logical OR operations. Thus, following a test sequence, a failure indication at a particular bit position of the FARs 128 may indicate that a failure occurred on the corresponding data line at one or more DUT memory locations during the test sequence.

A set of fail counters 130 may be operatively coupled to the FARs 128 and may be associated one-to-one with the bit positions of the FARs 128. Each of the set of fail counters 130 may count instances of the failures occurring on the data bit to which it corresponds. The AHC 122 may read totals from the set of fail counters 130 at a selectable time. In some embodiments, the totals from the set of fail counters 130 may be read upon completion of a test suite of test patterns executed at varied values of the operational parameters, as described below.

An error-catch memory (ECM) 134 may be operatively coupled to the FARs 128. Contents of the FARs 128 may be transferred to the ECM 134, which may operate to store the contents of the FARs 128 for subsequent transfer to the AHC 122. In some embodiments, the contents of the FARs 128 may be stored at a selectable time.

A test parameter index module (TPIM) 140 may be operatively coupled to the ECM 134. The TPIM 140 may vary an address presented to the ECM 134 to select a storage location within the ECM 134. The TPIM 140 may also initiate the transfer of the contents of the FARs 128 to the ECM 134. In some embodiments, the TPIM 140 may initiate the transfer of the contents of the FARs 128 to the ECM 134 at a selectable time. For example, the contents of the FARs 128 may be transferred to the ECM 134 at a point in the test suite after executing a test pattern using a current value of the test parameter and before executing the test pattern using the next value of the test parameter. This may be referred to as a "post mode" of operation. Alternatively, the contents of the FARs 128 may be transferred to the ECM 134 after addressing a current memory location associated with the DUT 116 and before addressing a next memory location associated with the DUT 116.

A post-mode flag 144 may be operatively coupled to the TPIM 140. The post-mode flag 144 may direct the TPIM 140 to operate in the post mode. Operation in the post mode may thus include storing a set of error indication flags in the ECM 134 for each set of test patterns executed using a particular value of a slewed test parameter. Each bit of the set of error indication flags may correspond to a data line associated with the DUT 116.

As an example of post-mode operation, read strobe timing may be selected as an operational parameter to vary for a particular test suite. A first read strobe timing value of 100 nanoseconds (ns) may be selected. A "marching ones" test pattern may then be presented to the DUT 116 on all data lines and at one or more addresses. Each write operation may be followed by a read operation using the selected value of the read strobe timing parameter, 100 ns. Bits indicating failures may be OR'd into the FARs 128. Upon completion of the marching ones test pattern, the contents of the FARs 128 may be copied to a first location in the ECM 134. The FARs 128 may be reset and the read strobe timing set to 90 ns. The marching ones test pattern may again be presented to the DUT 116 and bits indicating failures OR'd into the FARs 128. Upon completion of the test pattern, a new failure accumulation in the FARs 128 may be copied to a second location in the ECM 134. The test suite may continue until the test pattern has been presented to the DUT 116 under all selected values of read strobe timing. Upon completion of the test suite, each entry in the ECM 134 may indicate which data lines presented at least one failure at the selected value of read strobe timing corresponding to the entry. The test suite may thus be completed at APG speeds, without intervention of the AHC. Of course, any test pattern known to those of skill in the art, such as checkerboard (alternating ones and zeros), complement, diagonal and double checkerboard, marching zeros, slide, row/column disturb, and fastest address axis for X or Y may be used.

The apparatus 100 may also include a microcode memory 148 operatively coupled to the post-mode flag 144. The microcode memory 148 may contain code to set the post-mode flag, to provide the test pattern, or both.

In a further embodiment, a system 180 may include one or more of the apparatus 100. The system 180 may comprise a single-die parametric memory device tester 184. The single-die parametric memory device tester 184 may comprise one tester of a bank of single-die parametric memory device testers operating in parallel. The parallel testers may operate in a memory device manufacturing environment, a memory device testing environment, or a memory device quality assurance environment, among other environments.

The single-die parametric memory device tester 184 may execute an outer loop by slewing through a series of values associated with an operational test parameter. The single-die parametric memory device tester 184 may also execute an inner loop associated with each iteration of the outer loop. The inner loop may comprise slewing through a series of addresses associated with a DUT 116 and by executing one or more test patterns at each of the series of addresses. The outer loop may be executed without intervention of an AHC 122 coupled to the single-die parametric memory device tester 184.

The system 180 may also include a DUT load board 188 to attach the DUT 116 to the single-die parametric memory device tester 184. The DUT 116 may comprise a dynamic random-access memory, a static random-access memory, a flash memory, and/or a microprocessor, among other microelectronic device types.

A host to configuration bus interface 190 may facilitate communications between the AHC 122 and the single-die parametric memory device tester 184. A serial bus 192 may communicatively couple the host to configuration bus interface 190 to the AHC 122. The host to configuration bus interface 190 may forward communications from the AHC 122 to components of the single-die parametric memory device tester 184 on an internal configuration bus 194.

Any of the components previously described may be implemented in a number of ways, including embodiments in software. Thus, the apparatus 100; the APG 106; the microelectronic device tester 108; the TPCRs 112; the DUT 116; the configuration register bus 118; the configuration bus arbiter 120; the AHC 122; the bus priority flag 124; the FARs 128; the set of fail counters 130; the ECM 134; the TPIM 140; the post-mode flag 144; the microcode memory 148; the system 180; the single-die parametric memory device tester 184; the DUT load board 188; the host to configuration bus interface 190; the serial bus 192; and the internal configuration bus 194 may all be characterized as "modules" herein.

The modules may include hardware circuitry, single or multi-processor circuits, memory circuits, software program modules and objects, firmware, and combinations thereof, as desired by the architect of the apparatus 100 and the system 180 and as appropriate for particular implementations of various embodiments.

The apparatus and systems of various embodiments may be useful in applications other than enabling an APG to access test parameter configuration space within a microelectronic device tester without AHC intervention. Thus, various embodiments of the invention are not to be so limited. The illustrations of the apparatus 100 and the system 180 are intended to provide a general understanding of the structure of various embodiments. They are not intended to serve as a complete description of all the elements and features of apparatus and systems that might make use of the structures described herein.

The novel apparatus and systems of various embodiments may be included in electronic circuitry used in high-speed computers, communication and signal processing circuitry, modems, single or multi-processor modules, single or multiple embedded processors, multi-core processors, data switches, and application-specific modules, including multi-layer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others. Some embodiments may include a number of methods.

Figure 2:
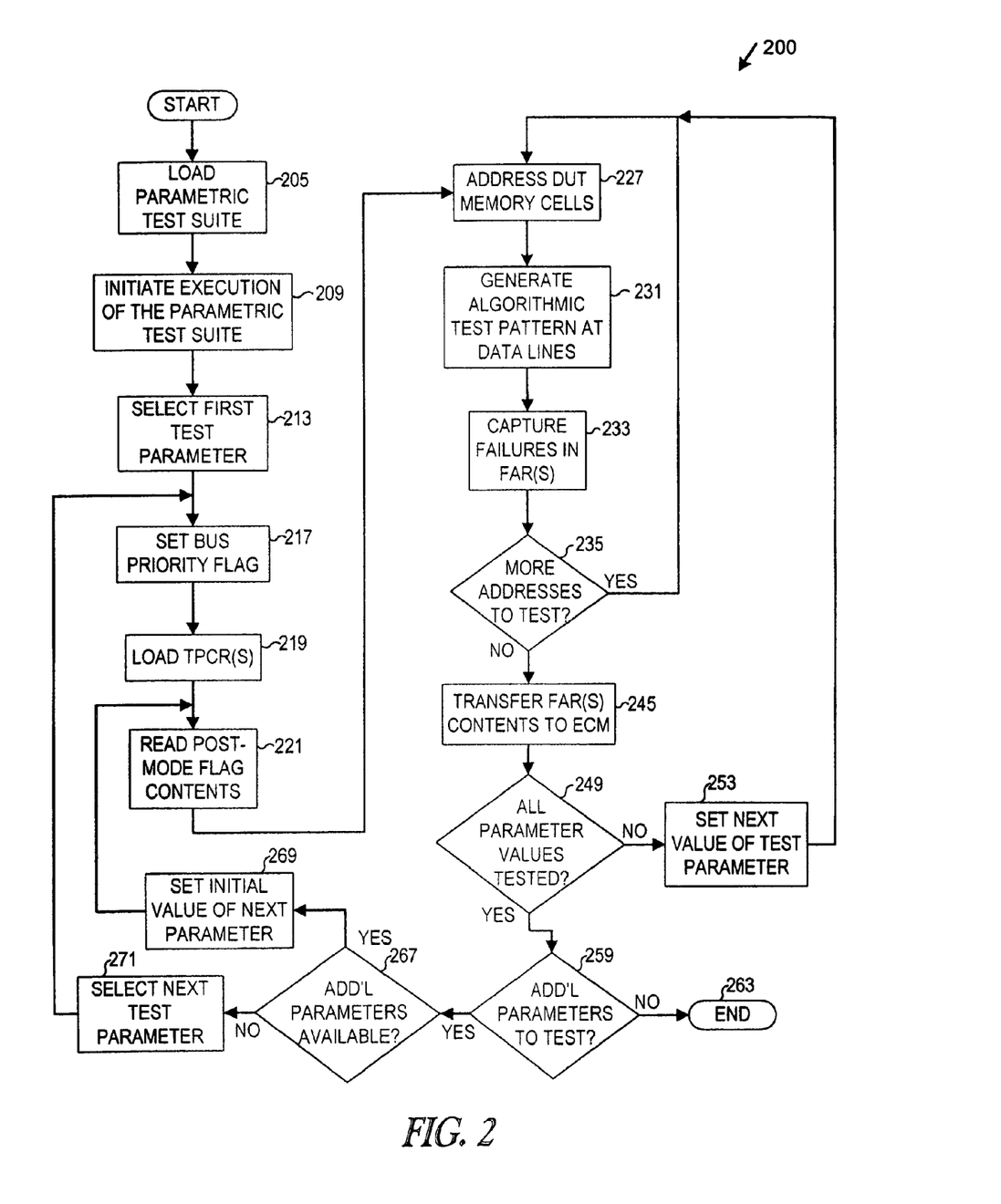
FIG. 2 is a flow diagram illustrating several methods according to various embodiments.

FIG. 2 is a flow diagram illustrating several methods according to various embodiments. Methods herein may enable an APG within a parametric microelectronic device tester to present iterative values of one or more operational parameters to a DUT. At each iteration, one or more test patterns may be presented to the DUT. The APG may capture test results from a complete set of iterations of the operational parameters without AHC intervention.

The APG may also access test parameter configuration space within the microelectronic device tester without AHC intervention. Turning back to FIG. 1, the APG 106 may, for example, access TPCRs 112 without intervention of the AHC 122. The APG may write values associated with a next operational parameter to be iterated to the TPCRs. As a result, a suite of parametric tests, iterated over the operational parameters, may be performed on the DUT without AHC intervention. Testing times may be reduced as a result.

In some embodiments, the parametric microelectronic device tester may comprise a memory device tester. In some embodiments, the parametric microelectronic device tester may be integrated onto a single semiconductor die.

A method 200 may commence at block 205 with loading a parametric test suite into a microcode memory associated with the APG from an AHC. The method 200 may continue at block 209 with initiating an execution of the parametric test suite using the APG. A first test parameter may be selected to load into one or more TPCRs, at block 213. The first test parameter may comprise a voltage parameter, a timing parameter, and combinations of voltage and timing, among other parameters.

The method 200 may also include setting a bus priority flag to grant the APG priority to the TPCRs over the AHC, at block 217. Turning back to FIG. 1, the bus priority flag 124, for example, may be set to grant the APG 106 priority to the TPCRs 112. Test parameter information may be loaded into the TPCRs from the APG, at block 219. The method 200 may further include reading post-mode flag contents, at block 221. The post-mode flag 144 of FIG. 1 may, for example, be set to indicate post mode operation.

The method 200 may continue at block 227 with addressing a group of memory cells associated with the DUT. Using the APG and an initial value of the first test parameter, an algorithmic test pattern may be generated at data lines associated with the group of memory cells, at block 231. The method 200 may also include capturing memory test failure indications associated with the data lines in one or more FARs, at block 233. Turning back to FIG. 1 for an example, memory test failures may be captured in the FARs 128. In some embodiments, capturing the memory test failure indications may include performing a logical OR operation on a bit failure indication associated with the data line and on a corresponding bit of the FARs to determine a new value of the corresponding bit of the FARs.

The method 200 may operate to determine if additional groups of memory cells remain to be tested using the initial value of the first test parameter, at block 235. If so, the method 200 may loop to block 227 until this condition is satisfied. Following the iteration of a particular value of a test parameter, the FARs may contain a cumulative indication of one or more failures associated with each data line tested using the particular value of the test parameter.

The method 200 may continue at block 245 with transferring FARs content to an ECM at a selectable time. The post-mode flag contents may indicate that post-mode operation is desired. If so, the FARs content may be transferred to the ECM after executing the algorithmic test pattern at each of the groups of memory cells using the initial value of the test parameter, and before executing the algorithmic test pattern at each of the groups of memory cells using a next value of the test parameter.

The method 200 may also include determining whether all values of the first test parameter have been tested, at block 249. If not, the method 200 may also include setting the next value of the first test parameter, at block 253. The method 200 may then loop back to block 227 to begin a new test iteration using the next value of the first test parameter. If all desired values of the first test parameter have been tested, the method 200 may continue at block 259 with determining whether one or more additional parameters are to be tested. If not, the method 200 may end at block 263.

If additional parameters are to be tested, the method 200 may determine whether values associated with the additional parameters are available, at block 267. If the values associated with the additional parameters are available, the method may include setting an initial value of a next test parameter, at block 269. The method 200 may then continue at block 221. If the values associated with the additional parameters are not available, the method 200 may include selecting the next parameter to be tested at block 271. The method 200 may then continue at block 217, and may include loading the TPCRs with values associated with the next parameter to be tested.

It may be possible to execute the activities described herein in an order other than the order described. And, various activities described with respect to the methods identified herein may be executed in repetitive, serial, and/or parallel fashion.

A software program may be launched from a computer-readable medium in a computer-based system to execute functions defined in the software program. Various programming languages may be employed to create software programs designed to implement and perform the methods disclosed herein. The programs may be structured in an object-orientated format using an object-oriented language such as Java or C++. Alternatively, the programs may be structured in a procedure-orientated format using a procedural language, such as assembly or C. The software components may communicate using a number of mechanisms well known to those skilled in the art, such as application program interfaces or inter-process communication techniques, including remote procedure calls. The teachings of various embodiments are not limited to any particular programming language or environment. Thus, other embodiments may be realized, as discussed regarding FIG. 3 below.

Figure 3:
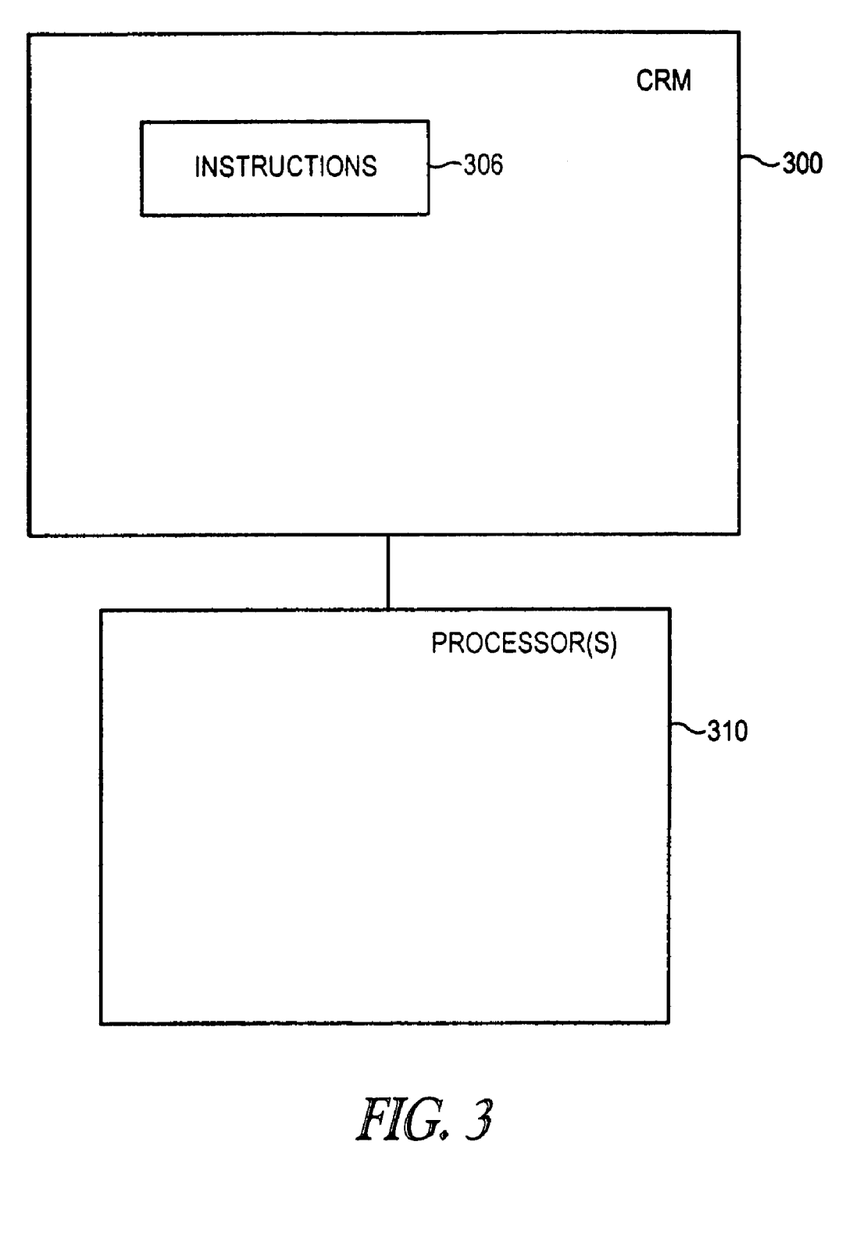
FIG. 3 is a block diagram of a computer-readable medium according to various embodiments.

FIG. 3 is a block diagram of a computer-readable medium (CRM) 300 according to various embodiments of the invention. Examples of such embodiments may comprise a memory system, a magnetic or optical disk, or some other storage device. The CRM 300 may contain instructions 306 which, when accessed, result in one or more processors 310 performing any of the activities previously described, including those discussed with respect to the methods 200 noted above.

Implementing the apparatus, systems, and methods disclosed herein may enable an APG associated with a microelectronic device tester to write values associated with a succession of operational parameters to be iterated to test parameter configuration space without AHC intervention.

The APG may also capture test results from a set of iterations of the operational parameters without AHC intervention. Reduced test times may result.

The accompanying drawings that form a part hereof show, by way of illustration and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

What is claimed is:

1. An apparatus comprising:
   an algorithmic pattern generator (APG) associated with a microelectronic device tester;
   a test parameter configuration register (TPCR) operatively coupled to the APG;
   a configuration register bus operatively coupled to the APG and to the TPCR to enable write operations from the APG to the TPCR; and
   an interface to couple the APG to an administrative host computer (AHC), wherein the APG is configured to access configuration space within the microelectronic device tester without intervention from the AHC.

2. The apparatus of claim 1, wherein the microelectronic device tester is integrated on a single semiconductor die.

3. The apparatus of claim 1, further comprising:
   a configuration bus arbiter coupled to the the configuration register bus to arbitrate access to the configuration register bus from the APG and from the AHC.

4. The apparatus of claim 3, further comprising:
   a bus priority flag coupled to the configuration bus arbiter to prioritize access to the configuration register bus.

5. The apparatus of claim 1, wherein the microelectronic device tester comprises a parametric memory device tester.

6. The apparatus of claim 5, further comprising:
   a fail accumulation register (FAR) associated with the APG, each bit position of the FAR corresponding to a data line of a device under test (DUT) to record at least one test failure associated with the data line as memory locations associated with the DUT are accessed.

7. The apparatus of claim 6, further comprising: a fail counter coupled to the FAR to count instances of the at least one test failure.

8. The apparatus of claim 6, further comprising: an error-catch memory (ECM) coupled to the FAR to store contents of the FAR.

9. The apparatus of claim 8, further comprising: a test parameter index module (TPIM) operatively coupled to the ECM to vary an address presented to the ECM and to initiate a transfer of the contents of the FAR to the ECM.

10. An apparatus comprising:
    an algorithmic pattern generator (APG) associated with a microelectronic device tester, the microelectronic device tester comprising a parametric memory device tester;
    a test parameter configuration register (TPCR) operatively coupled to the APG; and
    a configuration register bus operatively coupled to the APG and to the TPCR to enable write operations from the APG to the TPCR;
    a fail accumulation register (FAR) associated with the APG, each bit position of the FAR corresponding to a data line of a device under test (DUT) to record at least one test failure associated with the data line as memory locations associated with the DUT are accessed;
    an error-catch memory (ECM) coupled to the FAR to store contents of the FAR;
    a test parameter index module (TPIM) operatively coupled to the ECM to vary an address presented to the ECM and to initiate a transfer of the contents of the EAR to the ECM; and
    a post-mode flag operatively coupled to the TPIM to direct the TPIM to transfer the contents of the FAR to the ECM after executing a test pattern using a current value of a test parameter and before executing the test pattern using a next value of the test parameter.

11. The apparatus of claim 10, further comprising:
    a microcode memory operatively coupled to the post-mode flag to contain code to perform setting the post-mode flag.

12. An apparatus comprising:
    an error-catch memory (ECM) included in an algorithmic pattern generator (APG), the APG being associated with a parametric memory device tester, the ECM to store memory test failure indications for subsequent transfer to an administrative host computer;
    a test parameter index module (TPIM) operatively coupled to the ECM to vary an address presented to the ECM and to initiate a storage of the memory test failure indications; and
    a post-mode flag operatively coupled to the TPIM to direct the TPIM to vary the address presented to the ECM after executing a test pattern using a current value of a test parameter and before executing the test pattern using a next value of the test parameter.

13. The apparatus of claim 12, wherein the selectable time comprises at least one of a time after executing a test pattern using a current value of a test parameter and before executing the test pattern using a next value of the test parameter, or a time after addressing a current memory location associated with a device under test (DUT) and before addressing a next memory location associated with the DUT.

14. The apparatus of claim 13, wherein the test parameter comprises at least one of a timing parameter or a voltage parameter.

15. The apparatus of claim 12, further comprising:
a fail accumulation register (FAR) coupled to the ECM, each bit position of the FAR associated with a data line of a device under test (DUT) to record at least one test failure associated with the data line.

16. The apparatus of claim 15, further comprising:
a fail counter coupled to the FAR to count instances of the at least one test failure.

17. The apparatus of claim 12, further comprising:
a test parameter configuration register (TPCR) operatively coupled to the APG; and
a configuration register bus operatively coupled to the APG and to the TPCR to enable write operations from the APG to the TPCR.

18. An apparatus comprising:
an error-catch memory (ECM) included in an algorithmic pattern generator (APG), the APG being associated with a parametric memory device tester, the ECM to store memory test failure indications for subsequent transfer to an administrative host computer; and
a test parameter index module (TPIM) operatively coupled to the ECM to vary an address presented to the ECM and to initiate a storage of the memory test failure indications at a selectable time, the selectable time comprising at least one of a time after executing a test pattern using a current value of a test parameter and before executing the test pattern using a next value of the test parameter, or a time after addressing a current memory location associated with a device under test (DUT) and before addressing a next memory location associated with the DUT; and
a post-mode flag operatively coupled to the TPIM to direct the TPIM to vary the address presented to the ECM and to initiate the storage of the memory test failure indications after executing the test pattern using the current value of the test parameter and before executing the test pattern using the next value of the test parameter.

19. A method comprising:
loading test parameter information into a test parameter configuration register (TPCR) associated with a parametric microelectronic device tester, the parametric microelectronic device tester including an algorithmic pattern generator (APG) coupled to the TPCR, the test parameter information is provided by the APG; and
accessing configuration space within the parametric microelectronic device tester without intervention from an administrative host computer coupled to the parametric microelectronic device tester.

20. The method of claim 19, wherein the parametric microelectronic device tester comprises a memory device tester.

21. The method of claim 19, wherein the parametric microelectronic device tester is integrated on a single semiconductor die.

22. The method of claim 19, further comprising:
loading a parametric test information into a microcode memory associated with the APG from the administrative host computer.

23. The method of claim 19, further comprising:
initiating an execution of the parametric test suite using the APG; and
selecting a first test parameter included in the parameter information to load into the TPCR.

24. The method of claim 23, wherein the first test parameter comprises at least one of a voltage parameter or a timing parameter.

25. The method of claim 19, further comprising:
setting a bus priority flag to grant the APG a priority to access the TPCR.

26. The method of claim 19, further comprising:
addressing at least one group of memory cells associated with a device under test (DUT) using the APG;
executing an algorithmic test pattern at data lines associated with the at least one group of memory cells using the APG and an initial value of the first test parameter; and
setting a next value of the first test parameter.

27. The method of claim 26, further comprising:
performing at least one of setting an initial value of a second test parameter or re-loading the TPCR from the APG.

28. A method comprising:
at an algorithmic pattern generator (APG) associated with a parametric memory device tester, transferring content of a fail accumulator register (FAR) to an error-catch memory (ECM) at a selectable time, the FAR and the ECM being parts of the APG, wherein the selectable time comprises a time after executing an algorithmic test pattern at the at least one group of memory cells using an initial value of a test parameter and before executing the algorithmic test pattern at the at least one group of memory cells using a next value of the test parameter.

29. The method of claim 28, further comprising:
reading post-mode flag content associated with the parametric memory device tester; and
addressing at least one group of memory cells using the APG, the memory cells being associated with a device under test (DUT) coupled to the parametric memory device tester.

30. The method of claim 29, further comprising:
executing an algorithmic test pattern at data lines associated with the at least one group of memory cells using the APG and an initial value of the first test parameter; and
capturing the memory test failure indications associated with the data lines in the FAR.

31. The method of claim 30, wherein capturing the memory test failure indications comprises performing a logical OR operation on a bit failure indication associated with the data line and on a corresponding bit of the FAR to determine a new value of the corresponding bit of the FAR.

32. A method comprising:
at an algorithmic pattern generator (APG) associated with a parametric memory device tester, transferring content of a fail accumulator register (FAR) to an error-catch memory (ECM) at a selectable time, the FAR and the ECM being parts of the APG;
reading post-mode flag contents;
addressing at least one group of memory cells associated with a device under test (DUT) using the APG, wherein the selectable time comprises a time after executing an algorithmic test pattern at the at least one group of memory cells using an initial value of a test parameter and before executing the algorithmic test pattern at the at least one group of memory cells using a next value of the test parameter, if the post-mode flag contents indicate that a post-mode operation is desired.

33. A computer-readable medium having instructions, wherein the instructions, when executed, result in at least one processor performing:
　　loading test parameter information into a test parameter configuration register (TPCR) associated with a parametric microelectronic device tester, the parametric microelectronic device tester including an algorithmic pattern generator (APG) coupled to the TPCR, the test parameter information is provided by the APG; and
　　accessing configuration space within the parametric microelectronic device tester without intervention from an administrative host computer coupled to the parametric microelectronic device tester.

34. The computer-readable medium of claim 33, wherein the parametric microelectronic device tester comprises a memory device tester.

35. The computer-readable medium of claim 33, wherein the instructions, when executed, result in the at least one processor performing:
　　at the APG, transferring contents of a fail accumulator register (FAR) to an error-catch memory (ECM) at a selectable time, the FAR and the ECM being parts of the APG.

* * * * *

UNITED STATES PATENT AND TRADEMARK OFFICE
CERTIFICATE OF CORRECTION

| | | |
|---|---|---|
| PATENT NO. | : 7,707,473 B2 | Page 1 of 1 |
| APPLICATION NO. | : 11/497849 | |
| DATED | : April 27, 2010 | |
| INVENTOR(S) | : Paul A. LaBerge et al. | |

It is certified that error appears in the above-identified patent and that said Letters Patent is hereby corrected as shown below:

On the title page, item (75), in "Inventors", in column 1, line 3, delete "Bosie," and insert -- Boise, --, therefor.

In column 7, line 62, in Claim 3, after "the" delete "the".

In column 8, lines 9-11, in Claim 7, delete "7. The apparatus of claim 6, further including comprising: a fail counter coupled to the FAR to count instances of the at least one test failure." and insert -- 7. The apparatus of claim 6, further including comprising:
 a fail counter coupled to the FAR to count instances of the at least one test failure. --, therefor.

In column 8, lines 12-14, in Claim 8, delete "8. The apparatus of claim 6, further comprising: an error-catch memory (ECM) coupled to the FAR to store contents of the FAR." and insert -- 8. The apparatus of claim 6, further including comprising:
 an error-catch memory (ECM) coupled to the FAR to store contents of the FAR. --, therefor.

In column 8, lines 15-18, in Claim 9, delete "9. The apparatus of claim 8, further comprising: a test parameter index module (TPIM) operatively coupled to the ECM to vary an address presented to the ECM and to initiate a transfer of the contents of the FAR to the ECM." and insert -- 9. The apparatus of claim 6, further including comprising:
 a test parameter index module (TPIM) operatively coupled to the ECM to vary an address presented to the ECM and to initiate a transfer of the contents of the FAR to the ECM. --, therefor.

In column 8, line 38, in Claim 10, delete "EAR" and insert -- FAR --, therefor.

Signed and Sealed this

Fifteenth Day of June, 2010

David J. Kappos
*Director of the United States Patent and Trademark Office*